United States Patent [19]
Fasnacht et al.

[11] Patent Number: 5,886,530
[45] Date of Patent: Mar. 23, 1999

[54] TEST CONTACT CONNECTION CHECKING METHOD AND CIRCUIT

[75] Inventors: Glenn Fasnacht, Twinsburg; Wayne Goeke, Hudson, both of Ohio

[73] Assignee: Keithley Instruments, Inc., Cleveland, Ohio

[21] Appl. No.: 911,781

[22] Filed: Aug. 15, 1997

[51] Int. Cl.$^6$ .............................. G01R 27/14; G01R 31/04
[52] U.S. Cl. .......................... 324/611; 324/421; 324/538; 324/756
[58] Field of Search ...................................... 324/421, 601, 324/602, 609, 611, 696, 704, 705, 754, 756, 713, 715, 537, 538, 419

[56] References Cited

U.S. PATENT DOCUMENTS

| | | | |
|---|---|---|---|
| 3,822,398 | 7/1974 | Rovnyak | 324/419 |
| 4,178,543 | 12/1979 | Wrinn et al. | 324/421 |
| 4,342,957 | 8/1982 | Russell | 324/754 |
| 4,876,515 | 10/1989 | Ball | 324/538 |
| 4,954,782 | 9/1990 | Ball | 324/538 |

*Primary Examiner*—Diep N. Do
*Attorney, Agent, or Firm*—Pearne, Gordon, McCoy & Granger LLP

[57] ABSTRACT

A contact resistance check circuit and method for verifying that a sufficient electrical connection is established between a source and a sense lead of a Kelvin connection. The circuit includes a microprocessor for driving a transformer that is connected to the source/sense probe (i.e., contact resistance) with an input pulse. The input pulse is altered in relation to the magnitude of the contact resistance to produce a check pulse. A comparator is used to compare the check pulse with a threshold voltage and for generating a fault indication signal. A flip flop then stores the fault indication signal so that the fault indication signal may be monitored by the microprocessor.

8 Claims, 3 Drawing Sheets

TEST CONTACT CONNECTION CHECKING METHOD AND CIRCUIT

BACKGROUND OF THE INVENTION

The present invention generally relates to a device and method for verifying that a sufficient electrical connection is established between a source and a sense lead of a Kelvin connection.

It is common to test some devices by making a remote sensed measurement using a Kelvin connection. In a Kelvin connection, the device under test, or DUT, is probed by source leads at contact points of the DUT. Each contact point is also probed by a sense lead. The source and sense leads operate in combination to test the DUT by making appropriate electrical measurements.

There is a need in the art for a contact check to verify that a sufficient electrical connection is established between the source and sense leads of a Kelvin connection. The contact check must be made in such a way as to minimize any interference with the test being conducted and be completed in the shortest possible time. The contact check must be able to be made concurrently or consecutively with the test measurement.

SUMMARY OF THE INVENTION

The present invention provides a device and a method for performing a contact check of a Kelvin connection concurrently or consecutively with a test measurement. The present invention minimizes or eliminates any interference with the test measurement being taken and is completed in a very short time span. According to the present invention, the contact check circuit includes, a microprocessor for generating an input pulse. The input pulse is used to drive a primary winding of a transformer. A secondary winding of the transformer is connected to a contact resistance so that the input pulse is altered in relation to the magnitude of the contact resistance so as to form a check pulse. A comparator is used to compare the check pulse with a threshold voltage generated by a voltage divider. The comparator generates a fault indication signal which is stored by a flip flop connected to the comparator. The microprocessor monitors the signal stored by the flip flop.

According to another aspect of the invention, the check circuit includes a low pass filter connected to filter the check pulse before the comparator compares the check pulse with the threshold voltage.

According to another aspect of the invention, inverters are used to invert the input pulse before it drives the transformer and to invert the fault indication signal before it is stored.

BRIEF DESCRIPTION OF THE SEVERAL VIEWS OF THE DRAWINGS

These and further features of the present invention will be apparent with reference to the following description and drawings, wherein.

DETAILED DESCRIPTION OF PREFERRED EMBODIMENT

Figure 1:
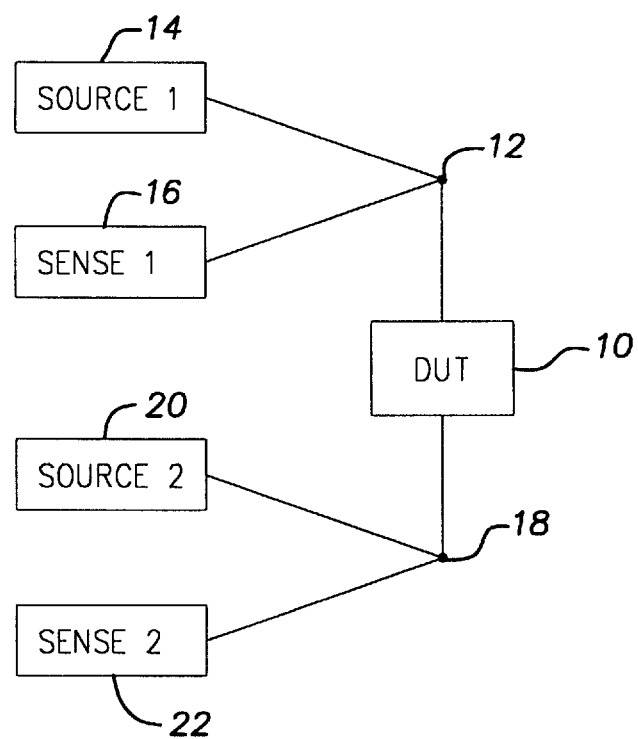
FIG. 1 is a circuit diagram of a typical Kelvin connection.

In the detailed description which follows, identical components have been given the same reference numerals, and, in order to clearly and concisely illustrate the present invention, certain features may be shown in somewhat schematic form.

FIG. 1 illustrates a typical Kelvin connection used for making a test measurement of a device under test, or DUT 10. The test measurement is typically, but not necessarily, a DC measurement. DUT 10 is subjected to measurement by probing a first contact point 12 of the DUT 10 with a first source 14 and a first sense 16, and by probing a second contact point 18 of the DUT 10 with a second source 20 and a second sense 22. There is an inherent resistance in the connection between any of the sources 14, 20 or senses 16, 22 and the respective contact points 12, 18. If a poor connection exists between any of these points the resistance of the connection will be too high for successful test measurement of the DUT 10. The present invention checks the contact effectiveness of the Kelvin connection by evaluating the inherent resistance in the path from the first source 14 through the first contact point 12 and to the first sense 16, and in the path from the second source 20 through the second contact point 18 and to the second sense 22. The resistance along these paths will be referred to as a contact resistance.

Figure 2:
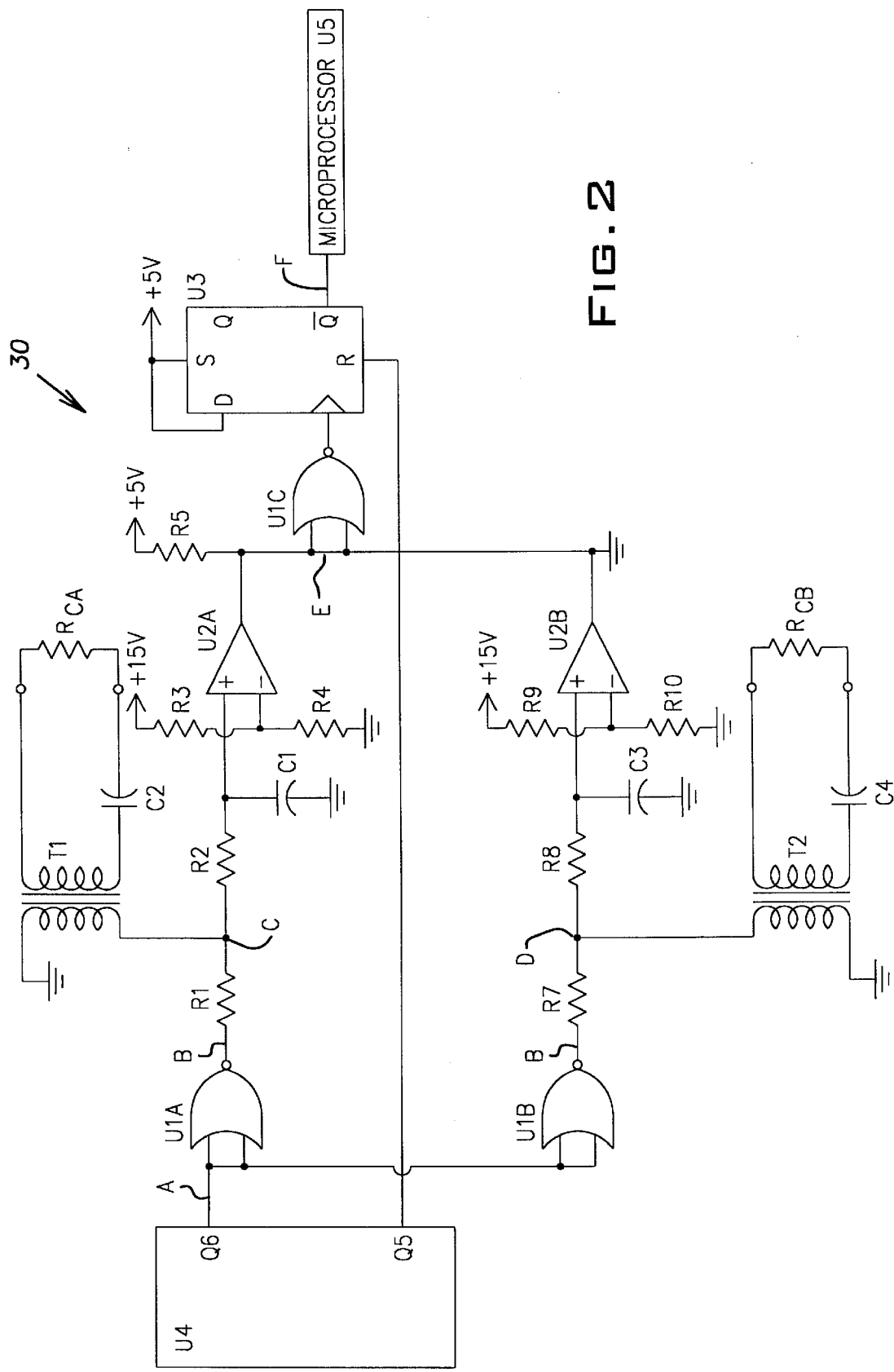
FIG. 2 is a circuit diagram of the present invention.
Figure 3:
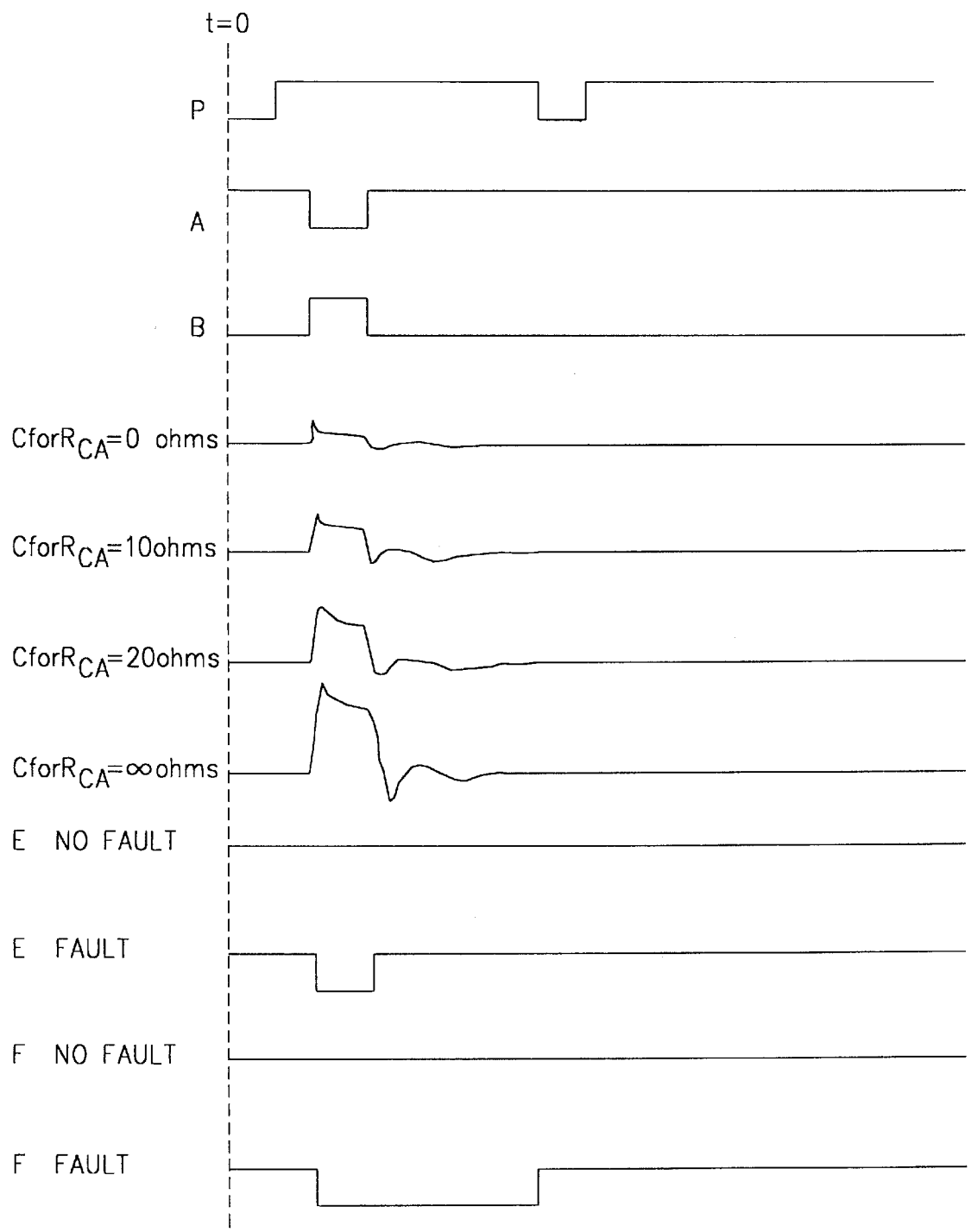
FIG. 3 is a timing diagram of the present invention.

Referring now to FIGS. 2 and 3, a circuit diagram and a timing diagram of the present invention are respectively shown. The two contact resistances of the Kelvin connection for the DUT 10 are shown as $R_{CA}$ and $R_{CB}$. If the magnitude of just one of the contact resistances is too high, then this is an indication that the Kelvin connection is faulty. If the Kelvin connection is faulty, then the reliability of any test measurements of the DUT will be questionable.

In order to conduct a contact check of the Kelvin connection, the circuit 30 shown in FIG. 2 is connected to the contact resistances $R_{CA}$ and $R_{CB}$. It should be understood that the circuit 30 is connected independent of any circuit (not shown) used to make the test measurement of the DUT 10.

Under software control, a microprocessor U4 generates a clearing pulse (indicated by P in FIG. 3) at pin Q5. The duration of the clearing pulse is preferably very short (e.g., 6 microseconds). Pin Q5 is connected to pin R of a flip flop U3. The pulse P clears the output $\overline{Q}$ of the flip-flip U3.

After a brief pause (e.g., a few microseconds), the software then generates a short input pulse A (e.g., a 10 microsecond pulse) at pin Q6 of the microprocessor U4. One skilled in the art will appreciate that the microprocessor can be replaced with other devices, such as switches or a one-shot. The input pulse is inverted by inverters U1A and U1B as shown as waveform B. Waveform B drives the primary windings of transformers T1 and T2 through R1 and R7. Secondary windings of transformers T1 and T2 are respectively connected in series with capacitors C2 and C4. The T1/C2 and T2/C4 networks are respectively connected to the contact resistances $R_{CA}$ and $R_{CB}$. The transformers T1 and T2 are used for common mode isolation of the contact check circuit 30 from the DUT 10.

Waveform B is altered so that the magnitude of the voltages at points C and D are respectively dependent upon the magnitude of the contact resistances $R_{CA}$ and $R_{CB}$. The resulting signal is a check pulse. FIG. 3 shows sample check pulses at point C for contact resistance $R_{CA}$ values of zero ohms (i.e., a perfect connection), 10 ohms, 20 ohms and infinite ohms (i.e., an open circuit). The same result will occur at point D for similar values of $R_{CB}$. As the example check pulses for point C indicate, greater magnitudes of the contact resistances $R_{CA}$ and $R_{CB}$ will produce higher voltages at points C and D for the input pulse A produced by pin Q6. Capacitors C2 and C4 are provided to prevent DC current from flowing between the sources and senses of $R_{CA}$ and $R_{CB}$.

Threshold voltages are generated for each contact resistance $R_{CA}$ and $R_{CB}$. The threshold voltage for $R_{CA}$ is generated by a voltage divider formed by resistors R3 and R4. The threshold voltage for $R_{CB}$ is generated by a voltage divider formed by resistors R9 and R10. Comparators U2A and U2B respectively compare the voltage of the check pulses at points C and D with the threshold voltages for $R_{CA}$ and $R_{CB}$.

Low pass filters are provided for each comparator U2A and U2B to eliminate false tripping of the comparators. The low pass filter for comparator U2A is formed by R2 and C1, and the low pass filter for the comparator U2B is formed by R8 and C3.

Therefore, if the voltage of the check pulses at either C or D does not exceed their respective threshold voltages, then the voltage at input E of U1C will remain constant indicting that there is no fault in the Kelvin connection (see FIG. 3). However, if the voltage of the check pulses at either C or D does exceed their respective threshold voltages, then the voltage at input E of U1C will not remain constant indicting that there is a fault in the Kelvin connection (see FIG. 3). The outputs of the comparators, or fault indication signals, are NOR-gated together through U1C so as to invert the fault indication signal. The flip flop U3 will store any indication of a fault at output $\overline{Q}$ as waveform F until it is cleared by a second pulse P.

A microprocessor U5 monitors waveform F stored at the output $\overline{Q}$ of flip flop U3 for a fault indication. If a fault occurs, the microprocessor U5 will display a contact check failed message. One skilled in the art will appreciate that microprocessors U4 and U5 may be consolidated into a single microprocessor.

Table 1 shows example values for the circuit components shown in FIG. 2.

TABLE 1

| | |
|---|---|
| U1A, U1B & U1C | 74HC02 |
| U2A & U2B | LM393 |
| U3 | 74HC74 |
| R1 | 2 kΩ |
| R2 | 10 kΩ |
| R3 | 15 kΩ |
| R4 | 160 Ω |
| R5 | 475 Ω |
| R7 | 2 kΩ |
| R8 | 10 kΩ |
| R9 | 15 kΩ |
| R10 | 160 kΩ |
| C1 | 47 pF |
| C2 | 0.47 µF |
| C3 | 47 pF |
| C4 | 0.47 µF |

The check circuit 30 has little or no impact on the test measurement of the DUT 10 and completes its check in a very short time period (less than 30 microseconds). The contact check may be made concurrently or consecutively with the DUT test measurement.

One skilled in the art will appreciate that the DUT 10 may have additional contact points connected to additional sources and senses. The present invention may be adapted to check any additional contact resistances by replicating the circuitry of the present invention. Alternatively, only one contact resistance need be measured by reducing the circuitry of the present invention to a single transformer/comparator network.

One skilled in the art will also appreciate that the contact resistance may have the properties of an impedance and will therefore be a contact impedance. The present check circuit 30 may also be used to verify the electrical connection in the presence of a contact impedance.

Although particular embodiments of the invention have been described in detail, it will be understood that the invention is not limited correspondingly in scope, but includes all changes and modifications coming within the spirit and terms of the claims appended hereto.

What is claimed is:

1. A method of checking a contact impedance, comprising the steps of:

providing a device under test having a contact point connected to a source lead and a sense lead, said contact impedance being the impedance from the source lead through the contact point to the sense lead;

applying a pulse to the contact impedance to create a check pulse; and comparing the check pulse with a threshold to produce a signal indicative of a contact fault.

2. A method for checking a contact resistance, comprising the steps of:

generating a pulse by a microprocessor;

driving a transformer connected to the contact resistance with said pulse so as to create a check pulse, generating a threshold voltage with a voltage divider;

comparing the check pulse and the threshold voltage to generate a contact fault indication signal;

storing the fault indication signal; and monitoring the stored signal by the microprocessor.

3. The method according to claim 2, further comprising the steps of:

inverting said pulse before driving the transformer; and inverting the fault indication signal before storing the fault indication signal.

4. The method according to claim 2, further comprising the step of filtering the check pulse with a low pass filter before the step of comparing the check pulse and the threshold voltage.

5. A contact resistance check circuit, comprising:

a microprocessor for generating a pulse;

a transformer having a primary winding connected to be driven by said pulse and a secondary winding connected to the contact resistance, said transformer/contact resistance connection altering said pulse in relation to the magnitude of the contact resistance so as to create a check pulse;

a comparator connected to compare the check pulse and a threshold voltage generated by a voltage divider, said comparator generating a contact fault indication signal; and a flip flop connected to store the fault indication signal for monitoring by the microprocessor.

6. The circuit according to claim 5, further comprising a low pass filter connected to filter the check pulse before the comparator compares the check pulse with the threshold voltage.

7. A contact resistance check circuit, comprising:

a microprocessor for generating a pulse;

an inverter connected to the microprocessor for inverting said pulse;

a transformer having a primary winding connected to be driven by the inverted said pulse and a secondary winding connected to the contact resistance, said transformer/contact resistance connection having the effect of altering the inverted said pulse in relation to the magnitude of the contact resistance so as to create a check pulse;

a comparator connected to compare the check pulse and a threshold voltage generated by a voltage divider, said comparator generating a contact fault indication signal;

a second inverter for inverting the fault indication signal; and a flip flop connected to the second inverter and for storing the inverted fault indication signal for monitoring by the microprocessor.

8. The circuit according to claim 7, further comprising a low pass filter connected to filter the check pulse before the comparator compares the check pulse with the threshold voltage.

* * * * *